United States Patent [19]

Stephan

[11] 4,214,015
[45] Jul. 22, 1980

[54] METHOD OF COATING METAL SUBSTRATES WITH ALLOYS AT ELEVATED SUBSTRATE TEMPERATURES

[75] Inventor: Herbert Stephan, Bruchköbel, Fed. Rep. of Germany

[73] Assignee: Leybold-Heraeus GmbH, Fed. Rep. of Germany

[21] Appl. No.: 960,896

[22] Filed: Nov. 15, 1978

[30] Foreign Application Priority Data

Oct. 5, 1978 [DE] Fed. Rep. of Germany ....... 2820289

[51] Int. Cl.² ............................................. C23C 13/02
[52] U.S. Cl. ..................................... 427/42; 427/250; 427/319; 427/374.3; 427/398.4
[58] Field of Search .................. 427/383 D, 374 B, 46, 427/250, 42, 319

[56] References Cited

U.S. PATENT DOCUMENTS

| | | | |
|---|---|---|---|
| 3,155,532 | 11/1964 | Basile | 427/319 |
| 3,251,712 | 5/1966 | Berger | 427/319 |
| 3,652,325 | 3/1972 | D'A Hunt | 427/250 |
| 3,676,085 | 7/1972 | Evans et al. | 427/250 |

FOREIGN PATENT DOCUMENTS

2714729 11/1975 Fed. Rep. of Germany.
2520192 10/1977 Fed. Rep. of Germany.

*Primary Examiner*—Ralph S. Kendall
*Attorney, Agent, or Firm*—Sprung, Felfe, Horn, Lynch & Kramer

[57] ABSTRACT

Method for coating metal substrates with alloys wherein the substrates are at a temperature above 500° C. The coating process is interrupted temporarily at least once and the substrates are allowed to cool by at least 30° C. Before the beginning of or during the resumed coating process, the substrate temperature is substantially restored.

6 Claims, No Drawings

METHOD OF COATING METAL SUBSTRATES WITH ALLOYS AT ELEVATED SUBSTRATE TEMPERATURES

BACKGROUND

This invention concerns a method of coating metal substrates with alloys at a substrate temperature above 500° C., preferably between 800° C. and 1100° C.

It is known to heat substrates to temperatures which are considerably above room temperature, for the purpose, for example, of increasing the strength of adhesion between the base metal forming the substrate and the vacuum deposited coating by intermetallic diffusion. Hitherto the effort has been made to keep the substrate temperature at a level as uniform as possible throughout the vacuum depositing process.

In the vacuum depositing of oxidation-inhibiting and corrosion-inhibiting surface coatings on gas turbine blades coating thicknesses of an order of magnitude between 150 and $400 \times 10^{-3}$ mm have been necessary on account of the stability required. In the formation of such coatings from special CoCrAlY and NiCoCrAlY alloys suitable for the specified purpose, however, it has been found that seams and fringed crystals form in the coatings and partially nullify the protective qualities of the coating.

SUMMARY

The invention provides a vacuum coating method for applying alloys to metallic substrates, in which very homogeneous and tight coatings can be produced.

This is achieved in the initially described process in accordance with the invention by temporarily interrupting the coating process at least once, letting the substrates cool off by at least 30° C., preferably by 50° to 100° C., and then, before the beginning of or during the next coating period, substantially re-establishing the substrate temperature that was present prior to the cooling.

DESCRIPTION

It has surprisingly been found that, by the at least single interruption of the vacuum coating process, in conjunction with the cooling that is thus produced, coatings are obtained in which no seams reaching to the base material nor any fringed crystals are present. The interruption of the vacuum coating process quite obviously produces the effect that the surface flaws are not continued in the coating period following the interruption, and surface flaws that have already developed in the first layer or layers are even "healed" by the next layer or layers.

The method of the invention can be practiced in a variety of ways. For example, it is possible to perform the reheating right in the vacuum coating chamber by means of a separate heating system. This heating system can consist, for example, of resistance heaters which transfer the heat energy to the substrates by thermal radiation, but it can also consist of electron beam generators which bombard the substrates with electrons. An especially advantageous method of procedure in conjunction with an electron beam vaporizer is characterized by reheating the substrate after the cooling period by means of electrons reflected from the electron beam vaporizer. In this case advantage is taken of the peculiarity of an electron beam vaporizer in which not all of the electrons aimed at the evaporating material by an electron gun are directly converted to heat. Depending on the angle of incidence, a greater or lesser amount of the electrons are reflected. If care is taken to enable the reflected electrons to strike the substrate, a high degree of utilization of the costly beam energy will be achieved in this manner.

If, however, the vacuum coating apparatus is preceded by a heating chamber, the latter can be utilized to special advantage by letting the substrate temperature drop by 50 to 100 degrees by interrupting the coating and heating process, withdrawing the substrates into the heating chamber during or after the cooling, and there reheating them to the prescribed substrate temperature, then returning them to the vacuum coating chamber. Such a method of procedure has the advantage that the internal temperature of the heating chamber can be kept at a uniformly high level on account of the thermal inertia of the heating chamber materials, which is rapidly transferred to the substrates by radiation since they are already at a high temperature. The temperature of such a heating chamber can be controlled precisely so that there is no danger of overheating the substrates, least of all locally.

For the deposition of CoCrAlY or NiCoCrAlY alloy coatings on gas turbine blades of highly heat-resistant alloys, a substrate temperature of 1000° C. has proven to be especially favorable to intermetallic diffusion. In this case it is sufficient to interrupt the vapor coating process once, after about half of the required coating thickness has been deposited. The substrates are thus allowed to cool down to a temperature of 925° C., i.e., by about 75° C., and withdrawn into the heating chamber where they are reheated substantially to the original substrate temperature of 1000° C. As soon as this temperature is reached, the substrates are returned to the vacuum depositing chamber and then, in the second and final coating period, the coating is built up to the final thickness. It has been found that seams and fringed crystals that have initially formed are not continued through to the outer surface of the coat.

What is claimed is:

1. Method for the vapor deposition of a coating of oxidation and corrosion inhibiting alloys including alloys from the group of CoCrAlY and NiCoCrAlY on metal substrates in a vacuum coating chamber at a substrate temperature above 500° C. which comprises interrupting the coating process temporarily at least once, allowing the substrates to cool by at least 30° C. and no more than 100° C., and before the beginning of or during the resumed coating process the substrate temperature that was present before cooling is substantially restored.

2. Method of claim 1 wherein the substrate is at a temperature between 800° C. and 1100° C.

3. Method of claim 1 wherein the substrate is allowed to cool by 50° to 100° C.

4. Method of claim 1 wherein the reheating after cooling is performed in the vacuum coating chamber itself with a separate heat source.

5. Method of claim 1 carried out in the vacuum coating chamber with an electron beam vaporizer wherein reheating after cooling is performed by means of reflected electrons from the electron beam vaporizer.

6. Method of claim 1 carried out in the vacuum coating chamber preceded by a heating chamber wherein the substrate temperature is allowed to decrease by 50 to 100 degrees by interrupting the coating and heating process, the substrates are withdrawn into the heating chamber during or after the cooling, reheated to the prescribed substrate temperature and then returned to the vacuum coating chamber.

* * * * *

UNITED STATES PATENT AND TRADEMARK OFFICE
CERTIFICATE OF CORRECTION

PATENT NO. : 4,214,015
DATED : July 22, 1980
INVENTOR(S) : Herbert Stephan

It is certified that error appears in the above-identified patent and that said Letters Patent are hereby corrected as shown below:

Title Page, Foreign Application Priority Data,
"Oct. 5" should read
"May 10", 1978 [DE] Fed. Rep. of Germany ..... 2820289.

Signed and Sealed this

Twenty-eighth Day of October 1980

[SEAL]

Attest:

SIDNEY A. DIAMOND

Attesting Officer

Commissioner of Patents and Trademarks